United States Patent
Furukawa et al.

(10) Patent No.: US 6,303,272 B1
(45) Date of Patent: *Oct. 16, 2001

(54) PROCESS FOR SELF-ALIGNMENT OF SUB-CRITICAL CONTACTS TO WIRING

(75) Inventors: Toshiharu Furukawa, Essex Junction; Mark C. Hakey; Steven J. Holmes, both of Milton; David V. Horak, Essex Junction; Paul A. Rabidoux, Winooski, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/192,140

(22) Filed: Nov. 13, 1998

(51) Int. Cl.$^7$ ...................................................... G03C 5/00
(52) U.S. Cl. .......................... 430/314; 430/312; 430/313; 430/316; 430/317; 430/318; 430/394
(58) Field of Search .................................... 430/311, 313, 430/316, 394, 312, 314, 317, 318; 216/3.9; 438/423

(56) References Cited

U.S. PATENT DOCUMENTS

| | | | | |
|---|---|---|---|---|
| 4,326,805 | * | 4/1982 | Feldman et al. | 356/399 |
| 5,143,820 | * | 9/1992 | Kotecha et al. | 430/314 |
| 5,194,346 | * | 3/1993 | Rolfson et al. | 430/5 |
| 5,981,148 | * | 11/1999 | Brown et al. | 430/314 |
| 5,981,149 | * | 11/1999 | Yamaguchi | 430/316 |

\* cited by examiner

Primary Examiner—Mark F. Huff
Assistant Examiner—Saleha R. Mohamedulla
(74) Attorney, Agent, or Firm—John J. Goodwin

(57) ABSTRACT

A method for forming contacts on an integrated circuit that are self-aligned with the wiring patterns of the integrated circuit. In the method a thicker lower layer of a first material and a thinner upper layer of a second material are formed on a substrate. The features of the metal wiring is patterned first on the upper layer. The wiring pattern trenches are etched through the thinner surface layer, and partially through the second, thicker layer. After the wiring pattern is etched, the contacts for the wiring layer are printed as line/space patterns which intersect the wiring pattern. The contact pattern is etched into the lower, thicker layer with an etch process that is selective to the upper thinner layer. The contact is only formed at the intersection point of the wiring image with the contact image, therefore the contact is self-aligned to the metal.

18 Claims, 3 Drawing Sheets

PROCESS FOR SELF-ALIGNMENT OF SUB-CRITICAL CONTACTS TO WIRING

BACKGROUND OF THE INVENTION

1. Technical Field

The present invention relates to the fabrication of semiconductor microchip structures, and more particularly to methods for forming contact holes in microchips for establishing electrical contact between integrated circuit wiring.

2. Background Art

Photolithographic techniques permit certain portions of semiconductor materials on a circuit chip to be selectively removed or modified such that a layer of electrically connected devices such as transistors and capacitors can be formed.

A single layer of a circuit chip may be electrically connected in a number of ways. One way is to use the selective deposition and removal of a metal to create lines of metal on the surface of a chip to connect circuit components. In such processes, a thin metallic film such as copper, aluminum or tungsten is deposited over the surface of the chip. A layer of photoresist is then applied over the film and exposed to light of an appropriate wavelength using a mask that exposes a pattern of relatively narrow lines on the photoresist. The photoresist is then developed and etched, leaving metal in the pattern exposed on the resist. This pattern of metal forms the electrical connections for the single layer of the chip.

Another method of electrically connecting one layer of a chip is known as the damascene process. In the damascene process a dielectric such as silicon dioxide is deposited offer the surface of a chip. A layer of photoresist is applied to the silicon dioxide layer. The resist is then exposed to establish the desired pattern of interconnections. The photoresist is then developed and etched to produce trenches in the silicon dioxide pattern to form the interconnections for the layer. A metal layer such as aluminum, copper or tungsten is deposited over the surface of the chip to fill the trenches. The metal is then planarized so that it is removed from the surface of the chip except where it filled in the trenches. The metal filled trenches form a pattern of interconnections. Horizontal metal connections are referred to as wires and a typical chip includes one layer of devices and multiple layers of wires connected to the devices.

Although a microchip may consist of a single layer of wiring, normally several layers of wiring are needed for sufficient chip function. The layers of a microchip are typically separated by silicon dioxide or other dielectric to prevent one layer of a chip from interfering with the operation of another layer. The component devices on the layers of the chip however, must be electrically connected at appropriate locations through the silicon dioxide in order to interact. Thus, the silicon dioxide separating the wiring layers must be penetrated at the appropriate locations for the components on different layers to be electrically connected.

One way to electrically connect the layers of a chip is referred to as the dual damascene method. The dual damascene method is similar to the damascene process. The first step in the dual damascene process is to create trenches in the silicon dioxide for wires as previously described. The second step is to create openings through the silicon dioxide to a lower chip layer. The openings are made using a process of applying a resist, masking, exposing, developing and etching, as described hereinabove. The openings through a layer of silicon dioxide are referred to as vias. Typically, a via must be created through the silicon dioxide to extend between trenches on adjacent layers.

The dual damascene method of electrically connecting layers of a microchip requires careful alignment of vias and trenches. The tolerances that must be allowed to assure proper alignment of vias and trenches limits the density that may be obtained on a microchip. The conventional method of fabricating vias and trenches is to first create the trenches and then create the vias, as separate steps in the process.

An improvement in creating vias and trenches is disclosed in U.S. patent application, Ser. No. (Docket BU9-97-182), filed Nov. 30, 1998 by Furukawa et al. entitled A METHOD FOR FORMING SELF-ALIGNED FEATURES. The improvement employs a method for creating self-aligned vias and trenches by using two layers of resist, one of which masks the underlying layer such that a via may be formed only where a trench has been formed. This method employs two different photoresists layered one on top of the other. The lower photoresist layer (for the vias) is only exposed where the upper pliotoresist layer (for the trenches is also exposed. The result is that vias may only be created where a trench is to be created, and the vias and trenches are therefore self-aligned, and the wires formed in the trenches and connecting studs formed in the vias will also be self-aligned.

It is known that the lithographic scaling of contact holes in integrated circuits is more difficult than the lithographic sealing of line/space patterns because the optical enhancement techniques of off-axis illumination and alternating phase edge reticles cannot be applied to contact hole features.

These enhancement techniques provide good results when they are used with tightly nested features, or for isolated dark patterns. However, the techniques provide very little enhancement of isolated bright images such as with contact holes.

Previously, contacts have been scaled by printing a contact hole as the intersection of two perpendicular phase-edge line/space patterns on photoresist film prior to development, with two different reticles.

SUMMARY OF THE INVENTION

An object of the present invention is to provide an improved fabrication method for forming contacts in an integrated circuit chip.

Another object of the present invention is to provide a fabrication method for forming contacts on an integrated circuit chip with a line/space pattern in a hybrid photoresist.

Still another object of the present invention is to provide a fabrication process for forming contacts on an integrated circuit chip that are self-aligned with metal wiring patterns on the integrated circuit.

A further object of the present invention is to provide a method for forming contacts on an integrated circuit chip using a modified dual damascene process in which metal wiring is patterned first over an insulating substrate film.

Other features, advantages and benefits of the present invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

DESCRIPTION OF THE INVENTION

The present invention provides a method that forms contacts on an integrated circuit that are self-aligned with the wiring patterns of the integrated circuit. In the method the metal wiring is patterned first over an insulating substrate layer. The insulator layer is composed of two layers, one being a thicker layer underneath a thinner layer at the substrate surface. The wiring pattern trenches are etched through the thinner surface layer, and if desired, partially through the lower, thicker layer.

After the wiring pattern is etched, the contacts for the wiring layer are printed as line/space patterns which intersect the wiring pattern. The contact pattern is etched into the lower, thicker layer with an etch process that is selective to the thinner layer. As a result, the only location where a contact is formed is at the intersection of the wiring pattern with the photoresist space of the contact layer. The width of the contact is determined by the width of the wiring image and the width of the contact space in the photoresist. Since both these features are long openings, rather than small isolated contact openings, the usual methods of image enhancement for lines/spaces can be applied, such as off-axis illumination, phase-edge reticles and hybrid photoresist. The contact is only formed at the intersection point of the wiring image with the contact image, therefore the contact is self-aligned to the metal.

More particularly the lower thicker insulating layer is a dielectric such as silicon dioxide and the upper thinner layer is a hard mask material such as silicon nitride. The method uses a photoresist etch mask on the upper thinner layer of nitride to form a hard mask.

The hard mask is then used as an etch mask to form trench recesses for wiring lines in the lower, thicker silicon dioxide dielectric layer disposed on a substrate. A hybrid photoresist is used to form a second photoresist mask on the hard mask and this second photoresist mask in combination with the hard mask is used as an etch mask to form contact holes. The use of the hybrid photoresist permits the exposure to be made with the use of a phase shift mask or off-axis illumination as a means to enhance the resolution of the printed pattern.

A hybrid photoresist is a photoresist material that has, simultaneously, both a positive tone and a negative tone in response to exposure. The hybrid photoresist allows a single aerial image to be printed as a space/line/space combination rather than a single line or space, thereby permitting higher pattern densities. A discussion and example of a hybrid photoresist is provided in co-pending U.S. patent application Ser. No. 08/715,287 filed Sep. 16, 1996 by Hakey et al. entitled FREQUENCY DOUBLING HYBRID PHOTORESIST.

Figure 1:
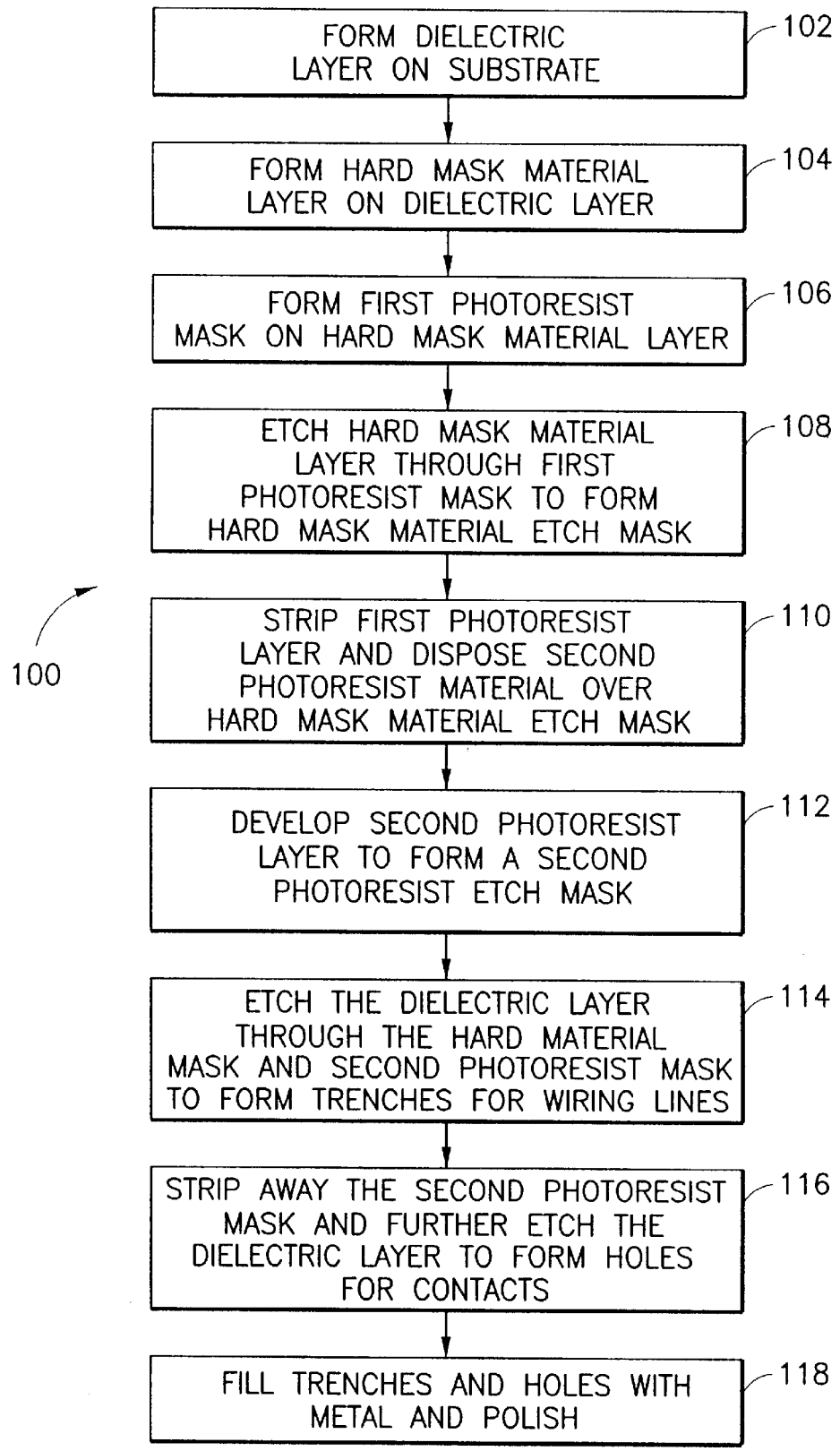
FIG. 1 is a flow diagram illustrating the steps in the method of the present invention.

Referring to FIG. 1, a flow diagram 100 is provided that illustrates the steps employed in the method of the present invention. In the first step 102, a thick dielectric layer composed, for example, of silicon dioxide, is formed over a substrate that may be composed of silicon or other suitable material.

In step 104, a thinner layer of hard mask material such as silicon nitride is formed over the thicker layer of dielectric material. Silicon is a non-conductive dielectric material, however a non-dielectric, conductive material such as tungsten can be used for the hard mask material.

In step 106, a first layer of hybrid photoresist material is disposed over the layer of hard mask material and is patterned, exposed and developed to leave portions of the photoresist layer remaining in the form of lines that will serve as a photoresist etch mask for the layer of hard mask material beneath. Image enhancement techniques such as off-axis illumination and phase-edge reticles may be used in the formation of the first photoresist etch mask In the next step 108, the hard mask material layer is reactively-ion-etched through the first photoresist mask to provide lines of recesses in the hard mask material layer to provide a hard material etch mask in the form of lines for a desired wiring pattern.

In step 110 the remaining portions of the first photoresist layer are stripped away and a second layer of photoresist material is disposed on the recessed layer of hard mask material and patterned and exposed. In step 112 the layer of second photoresist is developed to provide a second photoresist etch mask that is located over the hard mask material etch mask. The aforesaid image enhancement techniques of off-axis illumination and phase-edge reticles can be used in exposing the second photoresist layer.

In step 114 the dielectric layer beneath the hard mask material etch mask and the second photoresist etch mask is reactively-ion-etched selective to the hard mask material through both masks to provide recesses in the layer of dielectric material that will serve as trenches for the metal lines of the integrated circuit.

In the next step 116, the second photoresist etch mask is stripped away leaving the hard mask material, and the previously etched trench recesses in the dielectric layer are further reactively-ion-etched selective to the hard mask material to form deeper recesses aligned with the previously etched trench recesses that will serve as contact hole recesses for the contact metal.

In step 118 the trench recesses and contact hole recesses are filled with metal and polished to form wiring lines and contacts that are self-aligned with the wiring lines.

Referring now to FIGS. 2, 3, 4, 5, 6 and 7, a sequence of views of a portion of an integrated circuit structure are shown illustrating the physical changes produced by performing the method steps set forth in FIG. 1.

Figure 2:
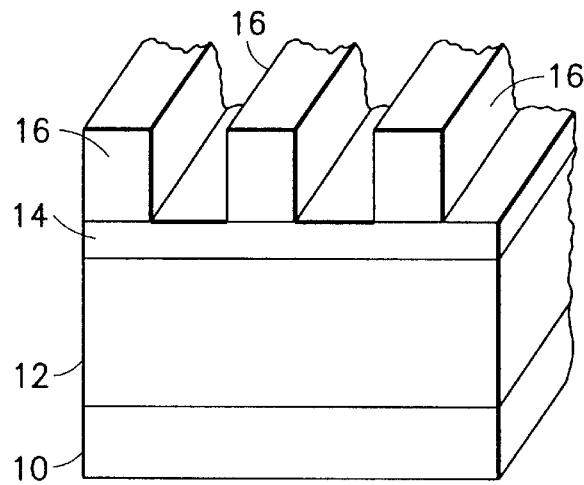
FIGS. 2, 3, 4, 5, 6 and 7 are schematic views showing steps in the fabrication process for sub-critical, self-aligned contacts in an integrated circuit microchip.
Figure 3:
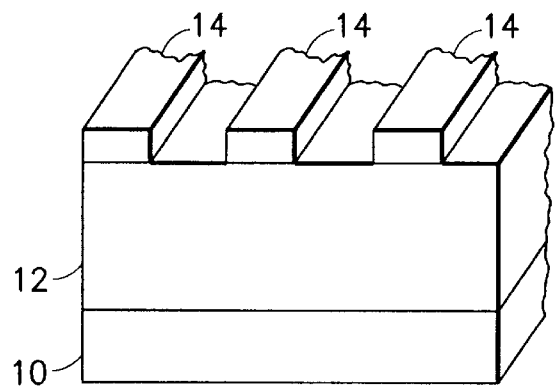

In FIG. 2, substrate 10, for example silicon, is shown on which a thicker layer 12 of dielectric material such as silicon dioxide is formed. A thinner layer 14 of hard mask material such as a non-conductive, dielectric material such as silicon nitride or a non-dielectric, conductive material such as tungsten is formed over the dielectric layer 12.

Next, a layer 16 of photoresist material, preferably a hybrid photoresist, is disposed on the layer of hard mask material 14 and the photoresist is masked, exposed and developed by lithographic techniques in the form of a wiring pattern wherein a first plurality of substantially linear and parallel photoresist regions 16 having a first direction remain on the layer 14. The photoresist regions 16 are used as an etch mask and the hard mask material layer 14 is reactively-ion-etched to remove portions and expose portions of the surface of dielectric layer 12. The photoresist material 16 is stripped, leaving the structure shown in FIG. 3.

Figure 4:
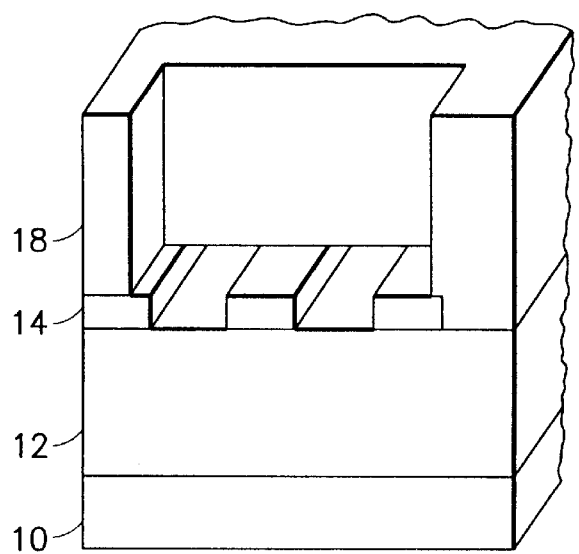

Next, as shown in FIG. 4, a second layer of hybrid photoresist 18 is formed on the remaining portions of hard mask material 14 and on the exposed surface of dielectric layer 12. The photoresist layer 18 is patterned, exposed and developed to form a photoresist etch mask as illustrated in FIG. 4.

Figure 5:
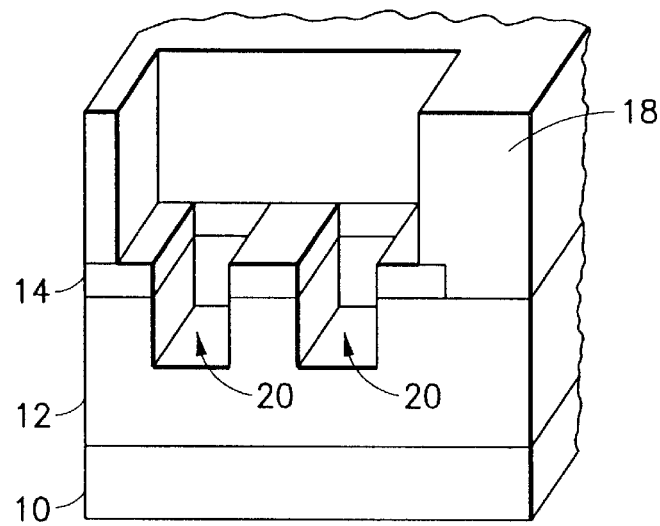

Using both the hard mask material 14 and the photoresist 18 as masks, the dielectric layer 12 is reactively-ion-etched selective to the hard mask material (i.e. nitride) to form trench recesses 20 which may be rectangular as shown in FIG. 5.

Figure 6:
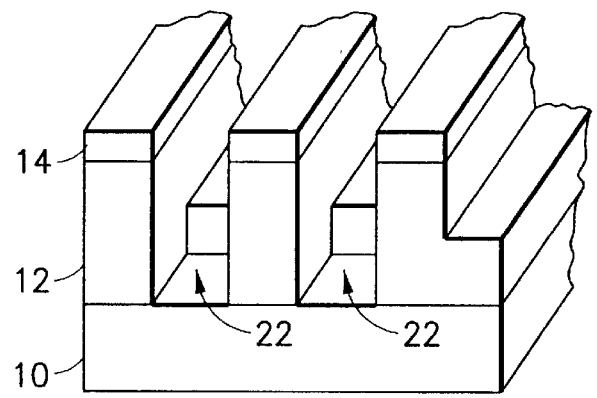

In FIG. 6 the photoresist layer 18 has been stripped away and the dielectric layer 12 is again reactively ion etched selective to the hard mask material (i.e. nitride) to provide deeper sub-critical contact hole recesses 22 etched down to the surface of substrate 10 to be filled with metal to serve as the contacts, which may be rectangular as shown in FIG. 6.

Figure 7:
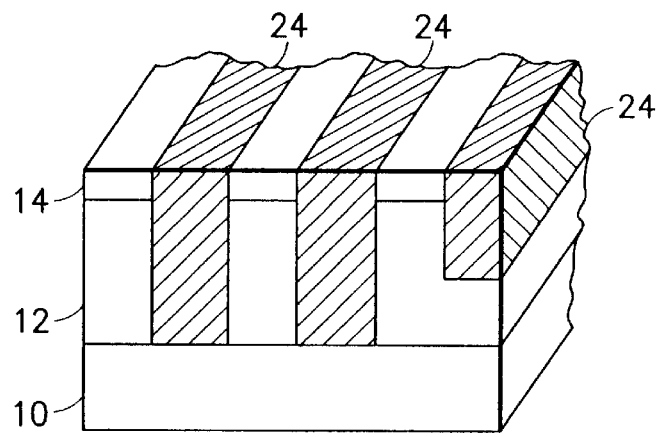

The trench recesses and contact hole recesses of the structure are then filled with an electrical conductor such as metal 24 as shown in FIG. 7. In FIG. 7 the remaining portions 14 of the hard mask material are shown still in place. This is possible if the hard mask portions 14 are composed of non-conductive, dielectric material. If conductive material such as tungsten is used for the hard mask, then the conductive portions must be removed from the structure of FIG. 7 such as by CMP.

In the described process, the contact pattern for the wiring pattern is etched into the lower, thicker dielectric layer 12 with an etch process that is selective to the thinner hard material layer 14. As a result, the only location where a contact is formed is at the intersection of the wiring pattern with the resist openings of the contact layer. The width of the contact is determined by the width of the wiring image and the width of the contact space. Since both of these features are long openings, rather than small isolated contact openings, conventional methods of image enhancement for lines/spaces can be used such as off-axis illumination and phase-edge reticles, and hybrid resist, as previously discussed.

Since the contact is only formed at the intersection point of the wiring image with the contact image, the contact is self-aligned to the wiring.

The etched openings 22 and 24 in the dielectric can be filled with metal 24 and polished, such as by CMP (chemical-mechanical polish) the same as for a conventional metallization process.

While the invention has been described in connection with a preferred embodiment, it is not intended to limit the scope of the invention to the particular form set forth, but on the contrary, it is intended to cover such alternatives, modifications and equivalence as may be included within the spirit and scope of the invention as defined in the appended claims.

What is claimed is:

1. A method for forming self-aligned wiring trenches and contact holes in a semiconductor substrate comprising the steps of:

(A) forming a lower dielectric layer over the substrate;

(B) forming an upper layer of hard mask material over the lower dielectric layer;

(C) forming a first photoresist layer over the upper hard mask material layer, (D) exposing the first photoresist layer through a first mask to form a first pattern for wiring;

(E) developing the exposed first photoresist layer to produce openings for wiring having a first width in the first patterned photoresist layer to form a wiring line etch mask;

(F) selectively etching the upper layer of hard mask material through the patterned photoresist etch mask to form a first, patterned wiring trench hard material etch mask;

(G) stripping away the first photoresist wiring line etch mask;

(H) forming a second photoresist layer that is separate from the first patterned photoresist layer over the wiring trench hard material etch mask;

(I) exposing the second, separate photoresist layer through a second mask to form a second pattern for contacts wherein two edges of the wiring trench hard material etch mask are employed in conjunction with two edges of the second photoresist layer to jointly define a contact hole pattern;

(J) developing the exposed second patterned photoresist layer to produce elongated rectangular shaped openings having a second width in the second photoresist layer to form a contact hole etch mask;

(K) selectively etching the lower dielectric layer through the hard material wiring trench etch mask and through the second photoresist contact hole etch mask to form self-aligned wiring line trenches and elongated, rectangular contact holes in the lower, dielectric layer, wherein the rectangular contact holes have a width determined by the width of the openings in the first patterned photoresist layer wiring line etch mask and the width of the openings in the second photoresist layer.

2. The method of claim 1 wherein the upper hard mask material is a dielectric layer.

3. The method of claim 1 wherein the upper hard mask material is composed of silicon nitride.

4. The method of claim 1 wherein the upper hard mask material is composed of tungsten.

5. The method of claim 1 wherein lower the dielectric layer is composed of silicon dioxide.

6. The method of claim 1 wherein the first and second photoresist layers are composed of hybrid photoresists.

7. The method of claim 1 wherein the step of etching the upper hard mask material layer comprises performing a selective reactive-ion-etch.

8. The method of claim 1 wherein the steps of exposing the first and second photoresist layers further comprise the step of using an alternating phase shift reticle.

9. The method of claim 1 wherein the step of exposing the second photoresist layer through a second mask further comprises the step of using off-axis illumination.

10. A method for forming self-aligned wiring trenches and contact holes in a semiconductor substrate comprising the steps of:

(A) forming a lower, dielectric layer over the substrate;

(B) forming an upper, hard mask material layer over the lower, dielectric layer;

(C) selectively etching the upper hard mask material layer to produce openings in the upper, hard mask material layer to form a first etch mask having a first pattern for defining wiring trenches;

(D) forming a hybrid photoresist layer over the first etch mask;

(E) exposing and developing the hybrid photoresist layer to produce a second pattern of elongated, rectangular shaped openings in the hybrid photoresist layer to form a second etch mask for defining rectangular contact holes;

(F) selectively etching the lower, dielectric layer through the first, wiring trench etch mask and through the second, contact hole etch mask to form self-aligned wiring line trenches and rectangular contact holes in the lower, dielectric layer wherein two edges of the first wiring trench etch mask are employed in conjunction with two edges of the hybrid photoresist layer to jointly define the contact hole pattern, and wherein the rectangular contact holes have a width determined by the width of the openings in the first wiring trench etch mask and the width of the openings in the hybrid photoresist layer;

(G) removing the second contact hole etch mask and filling the wiring line trenches and rectangular contact holes with metal.

11. The method of claim 10 wherein the upper, hard mask material is a non-conductive dielectric layer.

12. The method of claim 10 wherein the upper, hard mask material is a non-conductive dielectric layer composed of silicon nitride.

13. The method of claim 10 wherein the upper, hard mask material is a conductive, non-dielectric layer.

14. The method of claim 10 wherein the upper, hard mask material is a conductive, non-dielectric layer composed of tungsten.

15. The method of claim 10 wherein the lower dielectric layer is composed of silicon dioxide.

16. The method of claim 10 wherein the step of etching the upper hard mask material comprises performing a selective reactive-ion-etch.

17. The method of claim 10 wherein the step of exposing the hybrid photoresist layer further comprise the step of using an alternating phase shift reticle.

18. The method of claim 10 wherein the step of exposing the hybrid photoresist layer further comprises the step of using off-axis illumination.

* * * * *